(12) United States Patent
Ho et al.

(10) Patent No.: US 8,797,064 B1
(45) Date of Patent: Aug. 5, 2014

(54) HYBRID H-BRIDGE AND CML DRIVER

(71) Applicant: Lattice Semiconductor Corporation, Hillsboro, OR (US)

(72) Inventors: Vinh Ho, Milpitas, CA (US); Magathi Jayaram, San Jose, CA (US); Allan Lin, Cupertino, CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 106 days.

(21) Appl. No.: 13/738,265

(22) Filed: Jan. 10, 2013

Related U.S. Application Data

(60) Provisional application No. 61/714,636, filed on Oct. 16, 2012, provisional application No. 61/699,002, filed on Sep. 10, 2012.

(51) Int. Cl.
*H03K 19/094* (2006.01)
*H03K 19/0185* (2006.01)

(52) U.S. Cl.
CPC .............................. *H03K 19/018521* (2013.01)
USPC .................................. 326/86; 326/83; 326/68

(58) Field of Classification Search
None
See application file for complete search history.

(56) References Cited

U.S. PATENT DOCUMENTS

| | | | |
|---|---|---|---|
| 643,799 A | | 2/1900 | Levanseler |
| 5,153,466 A | * | 10/1992 | Stein et al. ...................... 326/90 |
| 5,710,506 A | * | 1/1998 | Broell et al. ................... 320/145 |
| 6,433,579 B1 | | 8/2002 | Wang et al. |
| 6,437,599 B1 | | 8/2002 | Groen |
| 6,965,263 B2 | * | 11/2005 | Bringivijayaraghavan ... 327/537 |
| 7,061,273 B2 | | 6/2006 | Wang et al. |
| 7,145,359 B2 | | 12/2006 | Hein et al. |
| 7,768,242 B2 | * | 8/2010 | Wei et al. ....................... 323/222 |
| 7,817,727 B2 | | 10/2010 | Kumar et al. |
| 7,852,061 B2 | * | 12/2010 | Liu et al. ......................... 323/313 |
| 8,149,024 B2 | | 4/2012 | Liu et al. |
| 2009/0085610 A1 | * | 4/2009 | Westwick ......................... 327/68 |
| 2009/0086517 A1 | * | 4/2009 | Wei et al. ......................... 363/50 |

* cited by examiner

*Primary Examiner* — Crystal L Hammond

(57) ABSTRACT

In one embodiment, a hybrid output buffer having both an H-bridge mode and a CML mode of operation includes a plurality of transistor switches arranged between an upper rail and a bottom rail. A first pair of the transistor switches couples between the upper rail and respective output nodes. A pair of resistors couples between the output nodes and a central node. During H-bridge mode, the hybrid output buffer controls a potential of the upper rail responsive to a feedback signal proportional to a difference between a potential of the central node and a common-mode voltage.

20 Claims, 2 Drawing Sheets

US 8,797,064 B1

HYBRID H-BRIDGE AND CML DRIVER

RELATED APPLICATION

This application claims the benefit of U.S. Provisional Application No. 61/714,636, filed Oct. 16, 2012, which is incorporated herein in its entirety.

TECHNICAL FIELD

The present invention relates generally to output buffers, and more particularly to a hybrid output buffer with both H-bridge and CML operating modes.

BACKGROUND

To satisfy high-speed data rate requirements, integrated circuits often include differential input and output buffers that operate according to various standards. For example, current mode logic (CML) and H-bridge are commonly-used differential signaling modes. To ensure interoperability with a wide variety of devices, an integrated circuit may include both CML and H-bridge output buffers. But separate output buffers demand additional die area. Thus, hybrid output buffers have been developed that can be configured into a CML mode of operation or an H-bridge mode of operation.

But conventional hybrid output buffers suffer from high power consumption and other issues. Accordingly, there is a need in the art for improved hybrid output buffers for integrated circuits.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

Reference will now be made in detail to one or more embodiments of the invention. While the invention will be described with respect to these embodiments, it should be understood that the invention is not limited to any particular embodiment. On the contrary, the invention includes alternatives, modifications, and equivalents as may come within the spirit and scope of the appended claims. Furthermore, in the following description, numerous specific details are set forth to provide a thorough understanding of the invention. The invention may be practiced without some or all of these specific details. In other instances, well-known structures and principles of operation have not been described in detail to avoid obscuring the invention.

Figure 1:
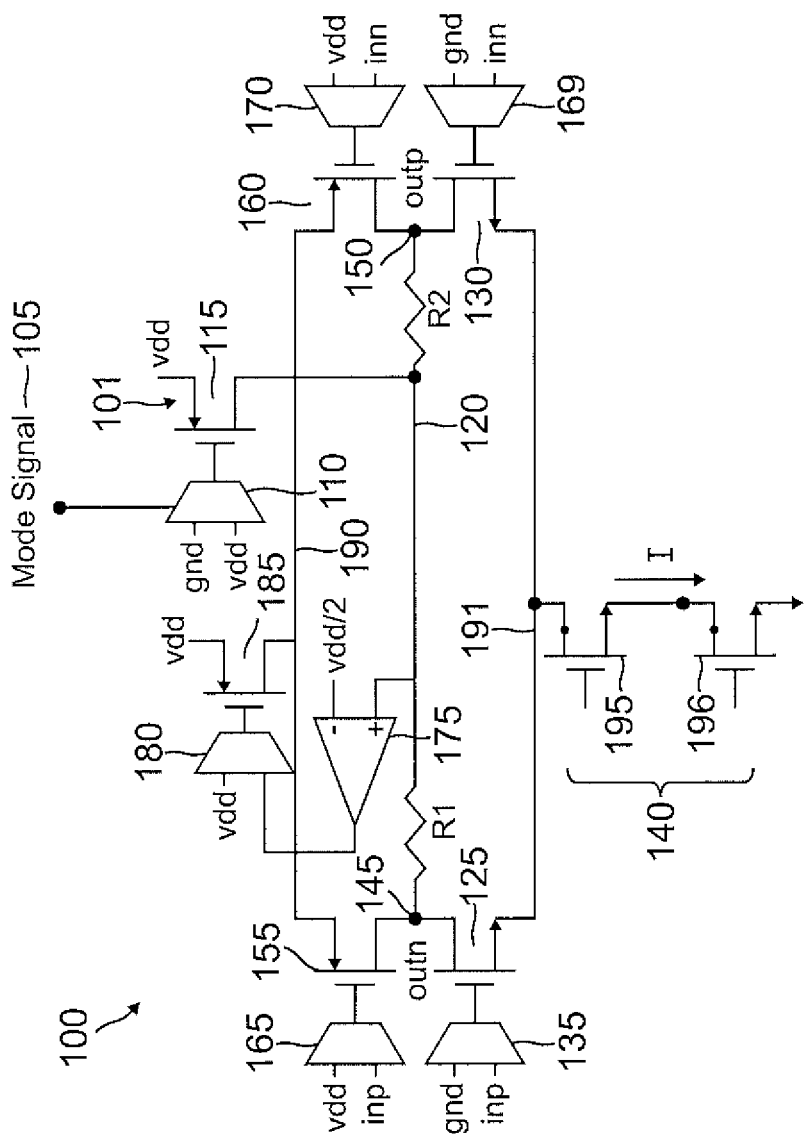
FIG. 1 is a schematic diagram of a hybrid output buffer having both a CML mode of operation and an H-bridge mode of operation.

Turning now to the drawings, FIG. 1 illustrates an embodiment of a low-power hybrid output buffer 100. This output buffer is suitable for a wide variety of integrated circuits such as a field programmable gate array (FPGA). A differential input signal for buffer 100 is formed by the difference between a first differential input voltage in and a second differential input voltage $in_n$. In response to processing the differential input voltages in either a an H-bridge mode or a current mode logic (CML) mode of operation, output buffer 100 produces a differential voltage output signal formed by the difference between a first differential output voltage out and a second differential output voltage $out_n$.

A mode control circuit 101 controls whether output buffer 100 operates in the H-bridge mode or the CML mode. For example, mode control circuit 101 may include a multiplexer 110 having an output driving a gate of a PMOS transistor 115. A mode signal 105 controls multiplexer 110 and in turn controls whether buffer 100 operates as an H-bridge output buffer or as a current mode logic (CML) output buffer. Depending upon the state of mode signal 105, multiplexer 110 either passes VDD or ground to the gate of PMOS 115. PMOS 115 has its source tied to VDD and its drain tied to a central node 120 between a resistor R1 and a resistor R2. Thus, if the gate of PMOS 115 is grounded, PMOS 115 turns fully on such that central node 120 is raised to VDD. Conversely, if the gate of PMOS 115 is raised to VDD, PMOS 115 is off such that central node 120 floats. In this fashion, the binary state of mode signal 105 controls the operating mode for hybrid output buffer 100 by controlling the voltage of central node 120. To select for CML operation, mode signal 105 controls multiplexer 110 to select the ground input such that central node 120 is pulled to VDD. Conversely, to select for H-bridge operation, mode signal 105 controls multiplexer 110 to pass VDD such that central node 120 floats. Mode signal 105 thus has at least a first and a second state to select for the desired H-bridge and CML modes of operation.

In CML mode, central node 120 is the equivalent of a power source. Current from this node flows through either resistor R1 or R2 depending upon the conductive states of a pair of NMOS transistors 125 and 130. The gate of NMOS 125 is driven by input voltage $in_p$ whereas the gate of NMOS 130 is driven by input voltage $in_n$. The differential output voltages $out_n$ and $out_p$ are formed with respect to the drains of NMOS transistors 125 and 130. A first output node 145 for providing output voltage $out_n$ is tied to the drain of NMOS 125 and a terminal for resistor R1. Similarly, a second output node 150 for providing output voltage $out_p$ is tied to the drain of NMOS 130 and a terminal for resistor R2.

The sources for NMOS transistors 125 and 130 couple through a bottom rail 191 to a current source 140. This current source determines the amount of bias current I that is drawn from central node 120 through resistor R1 and R2 to form the output voltages. For example, if the differential input voltages are such that NMOS transistor 125 is on and NMOS transistor 130 is off, bias current I will conduct though resistor R1. Thus, output voltage $out_n$ would be lower than output voltage $out_p$ in such a case. Conversely, if the input voltages are such that bias current I is switched to run through resistor R2, the output voltages would switch states such that output voltage $out_p$ would be lower than output voltage $out_n$.

To allow the ability to turn off NMOS transistor 125 when operation of hybrid output buffer 100 is not needed, a multiplexer 135 may be used to drive the gate of NMOS transistor 125. During CML mode operation (or H-bridge operation), multiplexer 135 is controlled so as to select for input voltage $in_p$. But when hybrid output buffer 100 is turned off, multiplexer 135 is controlled to select for ground to shut off NMOS transistor 125. An analogous multiplexer 169 controls the gate of NMOS transistor 130. Thus, multiplexer 169 selects for input voltage $in_n$ during the H-bridge and CML modes and selects for ground when hybrid output buffer 100 is powered off.

Output node 145 is also coupled to a drain for a PMOS transistor 155. Similarly, output node 150 is coupled to a drain for a PMOS transistor 160. These transistors are not used during CML mode. The gate of PMOS transistors 155 and 160 are driven by multiplexers 165 and 170, respectively. The sources of PMOS transistors 155 and 160 couple to an upper rail 190. During CML mode, multiplexers 165 and 170 are controlled so as to select for VDD to be applied to the gates of PMOS transistors 155 and 160. Thus, these transistors are off in CML mode. But in H-bridge mode, multiplexer 165 selects for input voltage $in_p$ whereas multiplexer 170 selects for input voltage $in_n$. These differential input voltages thus control the gates of PMOS transistors 155 and 160 during H-bridge mode. For example, suppose the input voltages are such that PMOS transistor 155 is conducting and PMOS transistor 160 is off. Because NMOS transistors 125 and 130 are driven in a complementary fashion to PMOS transistors 155 and 160, NMOS transistor 130 will also be on whereas NMOS transistor 125 will be off during this time. Bias current I will thus conduct from upper rail 190, through PMOS transistor 155, resistors R1 and R2, and through NMOS transistor 130 to current source 140. As the differential input voltages switch states, bias current I will switch to conduct through transistor PMOS 160, resistors R1 and R2, and through NMOS transistor 125.

To keep the common-mode output voltage for H-bridge mode operation at a desired common-mode voltage such as VDD/2, a differential amplifier 175 compares the voltage of central node 120 to the desired common-mode voltage and provides a resulting feedback voltage to a multiplexer 180 that also receives VDD. FIG. 1 illustrates an embodiment in which the desired common-mode voltage is VDD/2. The output of multiplexer 180 drives a gate of a PMOS transistor 185. The source of PMOS 185 is tied to VDD whereas its drain drives upper rail 190 that in turn drives the sources of PMOS transistors 155 and 160. In H-bridge mode, multiplexer 180 selects for the feedback voltage, which then drives the gate of PMOS 185. This is quite advantageous in that the voltage of upper rail 190 is kept no higher than it needs be to keep the common-mode output voltage at VDD/2 (or whatever common-mode voltage that is necessary for a given design). In this fashion, power consumption is minimized as contrasted to conventional hybrid output buffers. In CML mode, multiplexer 180 selects for VDD so that upper rail 190 floats in that mode. As discussed above, there is no function for PMOS transistors 155 and 160 in CML mode so that there is no need to keep upper rail 190 at an energized potential.

In one embodiment, current source 140 comprises a cascaded current mirror formed from a serial stack of an NMOS transistor 195 and an NMOS transistor 196. A cascaded current mirror is advantageous as compared to the use of common source approaches in conventional hybrid output buffers because a cascaded current mirror increases the output resistance. A capacitor (not illustrated) may be coupled between central node 120 and ground to meet return loss specifications.

Figure 2:
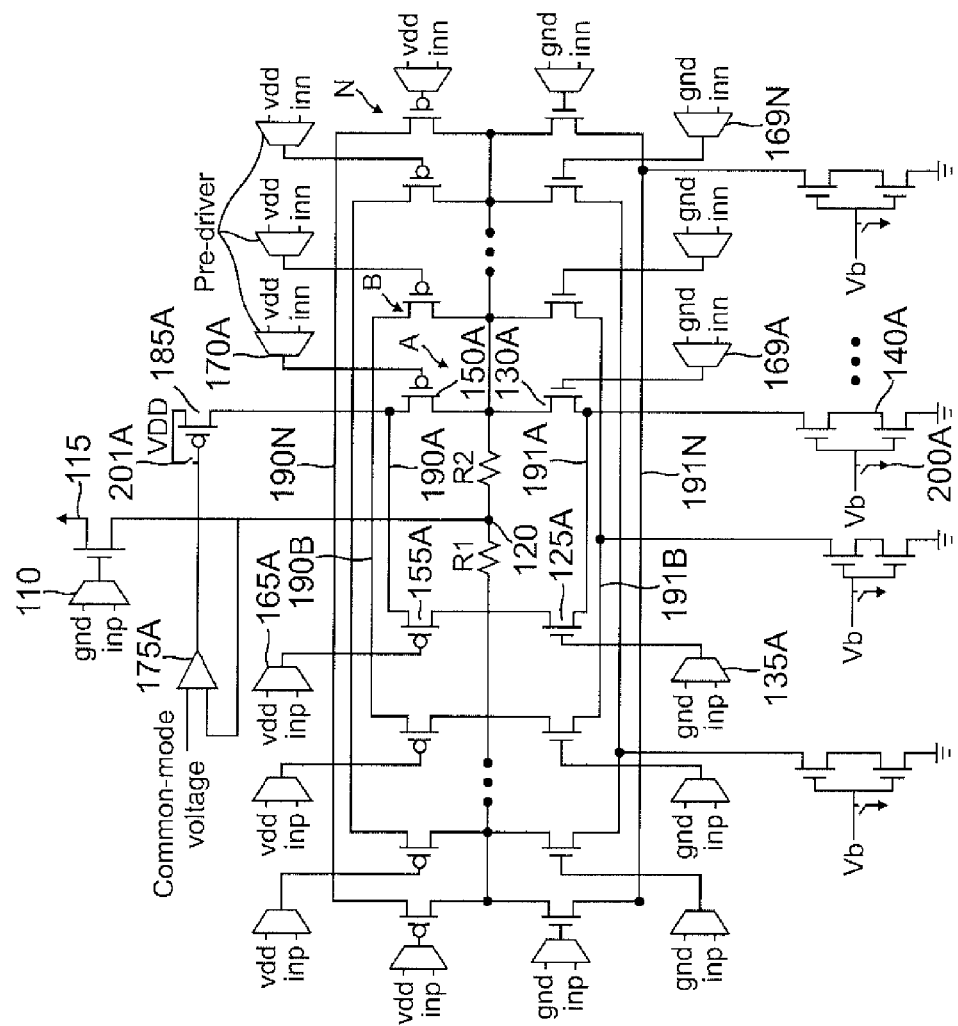
FIG. 2 is a schematic diagram of a plurality of hybrid output buffers arranged to share resistors and mode control circuitry.

Buffer 100 may be instantiated multiple times to form "slices." Each slice is an instantiation of buffer 100. FIG. 2 illustrates a plurality of slices that share resistors R1 and R2. In addition, multiplexer 110 is also shared by the slices. Referring back to FIG. 1, it may be seen that transistors 125, 130, 145, and 150 are arranged between upper rail 190 and lower rail 191. This same organization occurs with the slices of FIG. 2. For example, a first slice A has an upper rail 190A and a lower rail 191A. A second slice B has an upper rail 190B and a lower rail 191B, and so on for the remaining slices such that a final Nth slice has a upper rail 190N and a lower rail 191N. For example, in one embodiment there may be 10 slices. Each slice can be used independently and simultaneously in that upper and lower rails for a given slice are isolated from the remaining slices.

Each slice has the equivalent of transistors 125, 130, 150, and 155 arranged as discussed with regard to FIG. 1. For example, slice A has transistors 125A, 130A, 150A, and 155A. Each slice also has the equivalent of current source 140. For example, slice A has a current source 140A coupled between bottom rail 191A and ground. Note that each slice may be powered down independently of the remaining slices. Thus, each equivalent of current source 140 includes a switch that may ground the gates of NMOS transistors 195 and 196. For example, current source 140A includes a switch 200A. The slices also have the equivalent of multiplexers 135, 155, 169, and 170. For example, slice A includes multiplexers 135A, 155A, 169a, and 170A.

In addition, each slice has the equivalent of differential amplifier 175 and PMOS transistor 185. For illustration clarity, only slice A has these equivalents 175A and 185A shown in FIG. 2. As discussed with FIG. 1, the common-mode voltage need not be VDD/2 but could comprise some other value. Thus, differential amplifier compares the voltage of central node 120 to a desired common-mode voltage value. Analogous to the operation of switch 200A for current source 140A, a switch 201A can drive the gate of PMOS 185A to VDD to thereby turn off PMOS 185A. Multiplexer 180 thus need not be included. Indeed, referring back to FIG. 1, multiplexer 180 could be replaced by an equivalent of switch 201A.

Slices A through N have the low power advantages discussed with regard to hybrid output buffer 100 of FIG. 1. In addition, these slices are compact in that they all can share resistors R1, R2, central node 120, multiplexor 110, and PMOS 115. In one embodiment, a given slice could be assigned a pre-cursor, a cursor, or a post-cursor role in an intersymbol interference (ISI) mitigation architecture. Thus, the slices would simultaneously perform the desired pre-cursor, cursor, and post-cursor operations. To boost the input voltages, a pre-driver (not illustrated) may be associated with each slice. These pre-drivers can also be powered up and down independently analogously as discussed with regard to the slices.

It will be appreciated that the techniques and concepts discussed herein are not limited to the specific disclosed embodiments. The appended claims encompass all such changes and modifications as fall within the true spirit and scope of this invention.

We claim:

1. A hybrid circuit comprising:
   a pair of resistors coupled through a central node;
   a mode control circuit configured to charge the central node to a supply voltage in a current mode logic (CML) mode of operation and to allow the central node to float in an H-bridge mode of operation;
   a differential amplifier configured to compare a potential of the central node to a common-mode voltage to provide a feedback signal; and
   a first PMOS transistor having its gate driven by the feedback signal, the first PMOS transistor having it source coupled to the supply voltage and a drain coupled to an upper rail for the hybrid circuit.

2. The hybrid circuit of claim 1, further comprising:
   a current source configured to source a bias current.

3. The hybrid circuit of claim 2, further comprising:
   a second PMOS transistor having a source coupled to the upper rail and a drain coupled to a first one of the resistors; and
   a first NMOS transistor having a drain coupled to the drain of the second PMOS transistor and having a source coupled to a bottom rail, wherein the current source couples between the bottom rail and ground.

4. The hybrid circuit of claim 3, further comprising:
a third PMOS transistor having a source coupled to the upper rail and a drain coupled to a second one of the resistors; and
a second NMOS transistor having a drain coupled to the drain of the second PMOS transistor and having a source coupled to the bottom rail.

5. The hybrid circuit of claim 4, further comprising:
a first multiplexer configured to select between a first input voltage and the power supply voltage to provide an output signal for driving a gate of the second PMOS transistor; and
a second multiplexer configured to select between the first input voltage and ground to provide an output signal for driving a gate of the first NMOS transistor.

6. The hybrid circuit of claim 5, further comprising:
a third multiplexer configured to select between a second input voltage and the power supply voltage to provide an output signal for driving a gate of the third PMOS transistor; and
a fourth multiplexer configured to select between the second input voltage and ground to provide an output signal for driving a gate of the second NMOS transistor, wherein a differential input voltage for the hybrid circuit equals a difference between the second input voltage and the first input voltage.

7. The hybrid circuit of claim 6, wherein a first output node couples to the drains of the second PMOS transistor and the first NMOS transistor, and wherein a second output node couples to the drains of the third PMOS transistor and the second NMOS transistor, and wherein a differential output voltage for the hybrid circuit equals a difference between a potential for the first node and a potential for the second node.

8. The hybrid circuit of claim 2, wherein the current source is a cascaded current mirror source comprising a pair of NMOS transistors, and wherein the hybrid circuit is incorporated into a field programmable gate array.

9. The hybrid circuit of claim 1, further comprising:
a first multiplexer configured to select between the feedback signal and the power supply voltage to provide an output signal for driving the gate of the first PMOS transistor, wherein the first multiplexer is configured to select for the feedback signal in the H-bridge mode of operation and to select for the power supply voltage in the CML mode of operation.

10. A method, comprising:
in a hybrid output buffer, receiving a mode signal having a first state and a second state;
responsive to receiving the current mode signal in the first state, charging a central node of the hybrid output buffer to a power supply potential and operating the hybrid output buffer in a current mode logic (CML) mode;
responsive to receiving the current mode signal in the second state, floating a potential of central node and operating the hybrid output buffer in an H-bridge mode; and
while operating in the H-bridge mode, controlling a potential of an upper rail for the hybrid output buffer in response to a feedback signal that is proportional to a difference between the potential of the central node and a common-mode voltage.

11. The method of claim 10, further comprising: biasing the hybrid output buffer during operation in the H-bridge mode and during operation in the CML mode with a bias current from a current source.

12. The method of claim 11, wherein the current source comprises a cascaded current source.

13. The method of claim 10, wherein controlling the potential of the upper rail comprises driving a gate of a transistor with the feedback signal.

14. The method of claim 13, wherein driving the gate of the transistor comprises driving the gate of a PMOS transistor.

15. A circuit, comprising:
a first resistor;
a second resistor coupled to the first resistor through a central node;
a plurality of hybrid output buffers that share the first and second resistors and the central node; and
a mode control circuit configured to charge the central node to a supply voltage in a current mode logic (CML) mode of operation and to allow the central node to float in an H-bridge mode of operation.

16. The circuit of claim 15, wherein each hybrid output buffer includes a top rail and a bottom rail.

17. The circuit of claim 15, wherein each hybrid output buffer further includes a current source coupled between the bottom rail and ground, each current source configured to bias its hybrid output buffer with a bias current.

18. The circuit of claim 17, wherein each current source is a cascaded current mirror source.

19. The circuit of claim 17, wherein each hybrid output buffer is configured in the H-bridge mode to control a potential for its top rail responsive to a feedback signal proportional to a difference between a potential for the central node to a common-mode voltage.

20. The circuit of claim 19, wherein each hybrid output buffer is configured to turn on and off independently of the remaining hybrid output buffers.

* * * * *